United States Patent
Schwarte

(10) Patent No.: US 7,081,980 B2
(45) Date of Patent: Jul. 25, 2006

(54) METHOD AND DEVICE FOR DETECTING AND PROCESSING ELECTRIC AND OPTICAL SIGNALS

(76) Inventor: Rudolf Schwarte, Kreuztaler Str. 56, Netphen (DE) 57250

( * ) Notice: Subject to any disclaimer, the term of this patent is extended or adjusted under 35 U.S.C. 154(b) by 0 days.

(21) Appl. No.: 10/505,374

(22) PCT Filed: Feb. 21, 2003

(86) PCT No.: PCT/DE03/00542

§ 371 (c)(1),
(2), (4) Date: Jul. 22, 2005

(87) PCT Pub. No.: WO03/073602

PCT Pub. Date: Sep. 4, 2003

(65) Prior Publication Data

US 2006/0050352 A1    Mar. 9, 2006

(30) Foreign Application Priority Data

Feb. 22, 2002  (DE) ............................... 102 07 610

(51) Int. Cl.
  *G02B 26/00* (2006.01)
(52) U.S. Cl. .................. 359/237; 359/245; 359/238
(58) Field of Classification Search ............ 359/237, 359/238, 245, 325, 254; 257/222, 431, 444
See application file for complete search history.

(56) References Cited

FOREIGN PATENT DOCUMENTS

| DE | 197 04 496 A1 | 3/1998 |
| DE | 198 21 974 A1 | 11/1999 |
| EP | 1 152 261 A1 | 11/2001 |
| WO | WO 99/60629 | 11/1999 |

OTHER PUBLICATIONS

R. Schwarte et al., A new electrooptical mixing and correlating sensor. Facilities and Applications of the Photonic Mixer Device (PMD), Proceedings of the SPIE, (1997), pp. 245-253, vol. 3100.

R. Schwarte, Dynamic 3D-Vision, 2001 International Symposium on Electron Devices for Microwave and Optoelectronic Applications, 9 pages, (Nov. 2001).

*Primary Examiner*—Timothy Thompson
(74) *Attorney, Agent, or Firm*—The Maxham Firm

(57) ABSTRACT

A method for detecting and/or processing signal waves that produce charge carriers in an article sensitive to the signal waves. At least two modulation electrodes are provided, at least one of which is disposed in proximity to a readout-electrode in such a manner that, depending on the polarity sign of the modulation voltage of the modulation electrode, the current flowing across the readout electrode is positive or negative. The invention further relates to a device for detecting and processing signal waves. The invention provides a method and a device that is capable of interlinking various optical and/or electronic signals in a logically digital or analogous manner or to detect the course of optical signals by scanning (time interval measurements).

31 Claims, 8 Drawing Sheets

METHOD AND DEVICE FOR DETECTING AND PROCESSING ELECTRIC AND OPTICAL SIGNALS

BACKGROUND OF THE INVENTION

1. Field of the Invention

The present invention relates generally to optoelectronics and more specifically to methods and apparatus for detecting and processing electrical and optical signals.

2. Discussion of Related Art

Corresponding methods and apparatuses are known for example as "PMD elements" from German patent application No 196 35 932.5 or corresponding international patent application WO 98/10255 and DE 198 21 974.1 and corresponding international patent application WO 99/60629.

The state of the art in regard to that inherent pre-processing of optical signal waves is described for example in "Handbook of Computer Vision and Applications", Volume 1, Sensors and Imaging, edited by Jähne et al., Academic Press, on pages 463ff and also in dozens of publications relating to uses as laser radar, 3D cameras and OE interfaces for communication, for example on the homepage of the Institut für Nachrichtenverarbeitung of the University of Siegen.

That known photomixing detector (PMD) delivers a push-pull multiplication and correlation of the optical signal wave with an electrical push-pull signal and achieves a high level of noise and background light suppression and also a substantial simplification of and improvement in time measurement procedures. The known PMD and the methods used therewith are however relatively inflexible and have no time selection, no inherently switchable zero condition of the output signal and no analog or digital interlinking of a plurality of electrical and optical input signals. In particular it is not possible with that known method and the known PMD to mix and link together different optical signals.

The broad spectrum of electromagnetic and in particular optical technologies and methods of acquiring, processing and transmitting items of information together with the microelectronic and microoptical technologies has a key function in research, development and production and increasing significance in international commercial competition. Therefore an outstanding part is played by direct processing and interlinking of radiation signals—in particular optical signals—with electrical signals, for example optoelectronic (OE) interface components between optical and electrical technologies and systems, the OE transducers as receivers and the EO transducers as transmitters (for example laser diodes), but also optical signals with each other.

SUMMARY OF THE INVENTION

The present invention concerns a method and an apparatus for detecting and/or processing signal waves which in an article sensitive to the signal waves produce charge carriers which induce a signal current in at least one readout electrode, wherein there are provided at least two modulation electrodes, at least one of which is arranged in spatial proximity with the at least one readout electrode and the other of which is arranged in spatial proximity either with the same readout electrode or a further readout electrode.

The impressive success with and great advantages of optical information processing could be substantially better used and enlarged by a suitable versatile and intelligent method of optoelectronic detection, processing and transmission with new options in terms of direct inherent digital and analog signal processing of the incoming optical signal wave with electrical signals or other optical signals, which in addition can be inexpensively carried out in microelectronically and microoptically integrated fashion in the form of OE interface components or OE processor components respectively.

The aim would be to achieve an OE signal processing method and the implementation thereof as an OE signal processing component, which equally without additional electronics and so-to-speak on an integrated sensor element which is sensitive to signal waves, permits analog and digital mutual processing and interlinking of optical/electrical, optical/optical and electrical/electrical signals and signal waves.

In comparison with the foregoing state of the art accordingly the object of the present invention is to provide a method and an apparatus which are capable of providing for logical digital or analog interlinking of various optical and/or electronic signals or also detecting the configuration of optical signals by sampling (short-term measurement procedures).

In regard to the method that object is attained by the features of claim 1 and in regard to the apparatus it is attained by the features of claim 10.

In accordance with the invention therefore implementation of the first OE signal processing steps takes place directly in the detection process of a novel optoelectronic receiving and control component which at the same time satisfies the high demands for microelectronic integration, high band width and speed and low costs.

In accordance with the method according to the invention the modulation electrodes are modulated with modulation voltages which can be freely selected relative to each other and/or freely selectable phase relationships, wherein the readout currents produced by the modulation voltages of both modulation electrodes are preferably additively coupled. In regard to the apparatus the object of the invention is attained in that the modulation electrodes are arranged relative to the readout electrode or electrodes in such a way that in dependence on the sign of the modulation voltage of the respective modulation electrodes the current flowing by way of the associated readout electrode is positive or negative and that there is provided at least one device by which the relative phase relationship and/or the amplitude of the two modulation voltages can be freely set.

The known PMD elements were characterised in that the two modulation electrodes operated precisely in push-pull relationship and thereby conduct the charge carriers produced by radiation incidence alternately to a respective one of at least two of said electrodes or electrode groups. In a preferred variant of the PMD principle the readout currents or voltages of the readout electrodes were subtracted from each other in order thereby to detect the correlation of the modulation frequency with a frequency of the signal waves which had to be in a well-defined relationship with respect to the modulation frequency of the modulation electrodes.

In contrast thereto in its simplest variant the present invention does not necessarily provide for modulation of the signal wave, but in fact modulation electrodes, the voltage configurations and relative phase relationship of which are freely adjustable. As it is further provided in accordance with the invention that, in dependence on the sign of the modulation voltage of the respective modulation electrode the current flowing by way of the associated readout electrode is either clearly positive or clearly negative, it is possible for example with opposite phase relationship of the two modulation voltages that the two added currents of the readout electrodes, of which then one must necessarily be positive and one negative, at least partially cancel each other out. Preferably the spatial arrangement of the electrodes and the selection of the modulation voltages is such that, with operation of the modulation electrodes in push-pull relationship, the two positive and negative readout currents exactly cancel each other out. That corresponds to a so-called "zero circuit", or switching-off of the sensor by a so-called "modulation condition zero" MZ0. Due to a change in the phase relationship however a positive or negative current is immediately measured, depending on the direction in which the phase change occurred.

In that way it is possible for example to measure constantly or only over a short period a light signal which is incident for example on the sensor and possibly to sample same by respectively switching over the phase of one of the readout electrodes for a short time. The particularity of the apparatus according to the invention and the corresponding method is that admittedly in principle permanent continuous measurement takes place and no actual "switching-on" and/or switching-off of the entire sensor is required in that sense, but rather only the measurement conditions are briefly altered in such a way that two previously mutually cancelling signals are added together or at least only still partially cancel each other out.

Regarding use of the terms employed in the claims, it is to be noted that an article which is sensitive to signal waves can be for example a photosensitive semiconductor or a photoresistor or generally a semiconductor which can be sensitive to electromagnetic waves (including the range above and below the wavelengths of visible light), and that such an article can also be a photocathode in which the signal wave produces free electrons in the vacuum, which is controllable selectively by modulation electrodes towards at least one group of readout electrodes. That article however can also be for example a micro-channel plate with a PMD finger structure known from MCP-PMD (micro-channel plate PMD) [R. Schwarte, EDMO Proceedings, Vienna, November 15–17], but in operation according to the invention as an optoelectronic processor OEP with freely selectable modulation conditions, which generally is not to be referred to as photosensitive semiconductor material. An article sensitive to signal waves is therefore generally any article in which signal waves produce charge carriers. The term "modulation" in relation to the modulation electrodes is used in principle to denote any variable voltage, wherein in the extreme case constant voltages are also considered in accordance with the present invention as aperiodic "modulation voltages", as long as only at least one of the two constant voltages are modulated at least in the short term, in particular can execute a change in sign. In a preferred embodiment however the modulation voltages and in particular also the amplitudes thereof can be freely varied. In that way it is possible in particular to compensate for any asymmetries of the spatial-physical configuration and arrangement of the electrodes and thereby to ensure that, with the signs used for the modulation voltages, the added readout currents precisely cancel each other out.

In addition in accordance with a preferred embodiment of the invention it is provided that a plurality of different signal currents which are produced by different or mutually separate signal waves on separate sensor electrodes or apparatuses in accordance with the invention are added together. A particularly preferred embodiment of the method according to the invention provides that the signal waves are also modulated, wherein modulations of the modulation electrodes are in a well-defined relationship with modulation of the signal waves. In that way it is possible to simultaneously use the above-discussed PMD principle which is already known, with the method in accordance with the present invention, and to implement the measurement of signals in accordance with the principle of the present invention in such a way that exclusively the signal of the modulated signal wave is detected and all background signals are eliminated. For that purpose at least one of the basic elements in accordance with the invention, comprising at least one readout electrode and at least two modulation electrodes, is used in such a way that both modulation electrodes experience in in-phase relationship a rapid change in sign of the modulation voltage, in which case the readout current is integrated over at least one such period (of a modulation voltage change).

It will be appreciated that in that respect the signal waves must be modulated and the modulations of the modulation electrodes are in a well-defined relationship with the modulation of the signal waves.

If signals of various elements are to be linked together, it is possible, by suitable modulation of the phase relationships of the modulation voltages at the various elements which receive the signals that are to be linked together, to embody logical interlinkings such as AND, OR, XOR and the negatives thereof.

A particularly preferred embodiment of the invention is one in which the article which is sensitive to signal waves is a photosensitive semiconductor material and the readout and modulation electrodes are in the form of Schottky contacts. In that respect readout and modulation electrodes for example can engage comb-like into each other, but it is also possible for electrodes of one kind, which are arranged in a strip-like manner, to be arranged group-wise in mutually juxtaposed relationship, and for a respective other type of electrode (modulation electrode or readout electrode) also to be of a strip-like configuration and arranged beside the first strip group. For example two or more adjacent electrode strips or contacts can form a unitary readout electrode and therebeside a plurality of strips which are electrically connected together can form a modulation electrode. The term "photosensitive" is to be interpreted broadly in this respect and is not intended to denote a limitation to the optical spectrum just as long as, in this embodiment, a semiconductor material is available, which is sensitive to electromagnetic waves and in which mobile charge carriers are produced by the impinging electromagnetic waves.

In order to be able to apply the PMD principle, there must be a modulated signal wave so that the preferred embodiment either has devices for emitting and modulating a signal wave or however at least one PLL input circuit for detecting the signal modulation and for adapting the modulation frequency of the modulation electrodes and also for adjusting the phase of modulation of the modulation electrode.

The method according to the invention and the corresponding circuit process optical signal waves and electrical signals in the same procedure, in many different ways which go beyond the state of the art. By virtue of the flexible and versatile functions and processing options for optical and electrical signals, the method according to the invention is referred to hereinafter as an optoelectronic processor principle, referred to for brevity as the OEP principle, and the corresponding apparatus is referred to as an optoelectronic processor, referred to for brevity as the OEP.

The OEP principle permits in particular the following:
1) Two independent electrical signals are inherently interlinked with an optical signal P(t) in such a way that the associated photocurrent, with constant irradiation, is electrically controllable in the whole range from the greatest negative value modulation condition MZN by way of the zero condition MZ0 to the greatest positive value modulation condition MZP, with which the basic function of the so-called single OEP is identified.

2) In an expansion of functionality, two independent electrical signals are inherently interlinked with two optical signals $P_1(t)$ and $P_2(t)$ in such a way that the output photocurrent of that so-called double OEP is additionally also controllable in analog and digital fashion by the two optical signals within the limits of the available photocurrents, between the possible limit conditions MZN and MZP. If in the case of the double OEP with equally effective power levels $OEP_1$ with $P_1$ produces the current $I_{A1}$ and $OEP_2$ with $P_2$ produces the current $I_{A2}=I_{A1}$, then the combination affords for example for the differential current readouts: for $(P_1, P_2)=MZ0$ because of $I_{A1}-I_{A2}=0$ or logic "0"; for $(P_1, 0)=MZP$ because $I_A=I_{A1}$ corresponding to logic "1" and for $(0, P_2)=MZN$ because $I_A=-I_{A2}$ corresponding to logic "0" in binary logic or logic "−1" in ternary logic.

3) Further integration and interconnection of such OEP components in different technologies give rise to many novel complex OE signal processing and measuring methods and systems for a broad spectrum of present day tasks and problems arising in industry, science and business.

The optoelectronic processor OEP according to the invention can be used for expanding the OE signal processing functionality, for example for electrically switching the detector on and off, as is essential for time multiplex applications, and also for increasing the band width of a switchable EO mixer from DC into the GHz range, for improving and simplifying background light suppression, the execution of fast optical-electronic and optical-optical gate functions with corresponding base band capability, as well as the integration of spatially distributed processing functions, for example parallel communication and dynamic 3D measurements in space-time and in the position frequency area for lateral speed measurements. The new OE component involved affords uses in the communication area, for example for CDMA/TDMA free space transmission, in the optical networking of a so-called optical backplane instead of the multi-layer backplane as well as in polymer fibre networks with a bit rate of for example 1 Gb/s with at the same time a high level of sensitivity and a high degree of filling. Those specifications are nowadays not met by any known component, even only an approximately inexpensive one.

In accordance with the invention for example fast OE gates, OE analog switches, OE samplers, OE analog-digital converters, OE multiplexers and demultiplexers, 3D cameras on an OEP array basis can be embodied combined in accordance with the transit time principle, the triangulation principle and the Doppler of displaced position frequency analysis, for multi-channel and inexpensive OE routers (optical cross-connect), highly sensitive and fast mixers and correlators. In addition the ranges of use and the spectrum of the signal waves can be enlarged for example by new materials and technologies and corresponding apparatuses can be embodied for performing such methods.

The invention is based on the realisation that—going substantially beyond the known charge oscillation process of the PMD principle—the OEP principle provides, by analog and/or digital signal processing combination and interlinking of at least one or more functionally co-operating signal waves P(t) which generate photocharges in at least one photosensitive region, at least two independent modulation signals UM, by way of modulation electrodes M, control the flow of the associated photocharges to spatially closely adjacent readout electrodes A, preferably earth potential, and the readout currents are additively or subtractively combined to afford at least one output value, current value IA or voltage value $\Delta UA$, into or by way of a readout unit VAEH.

Highly integrated OEP structures which are preferably based on PMD structures such as MSM (metal semiconductor metal)-PMD and $(p^+n^-p^+)$- or $(n^+p^-n^+)$-PMD are advantageous—the latter because of the advantageous external modulation support by preferably insulated metal electrodes acted upon by a suitable offset voltage, also referred to as ME-PMD [R. Schwarte, EDMO Proceedings, Vienna, November 15–17, PCT DE 00/03632 and PCT DE 01/03914]—and in accordance with the invention permit very simple and effective circuit structures of high functionality.

The OEP principle according to the invention can also be implemented on the basis of the known PMD structures, in particular on the basis of the PG (photo gate)-PMD technology [DE 196 35 932.5 and DE 198 21 974.1] and the microprocessor MP (micro-channel plate)-PMD technology [PCT DE 00/03632 and PCT DE 01/03914]. For that purpose at least two groups of PG-PMD strip structure pixels $OEP_1$ and $OEP_2$—preferably in interleaved relationship—are respectively controlled by way of the independent push-pull modulation voltages ±UM for the photogate pairs and all associated readout electrodes pairs $A_l$ for left and $A_r$ for right of the charge oscillations are connected and combined with the readout currents $I_{Ar}=I_{Ar1}+I_{Ar2}$ as well as $I_A I=I_{A11}+I_{A12}$ to afford a push-pull output with the unipolar push-pull current +IA=IAr−IA1 and the corresponding output voltage $\Delta U_A$. That implementation of the PG-OEP principle in CMOS technology has some advantages of the well-managed technology and integratability, but in contrast there are disadvantages of the PG-OEP in the speed of sound. The necessary compensation of the photocurrent of the background illumination with the PG-OEP is afforded by the concepts proposed in accordance with the invention of difference readouts with a pure amplifier function or with an integrator function as shown in FIG. 2, with a common-mode feedback of the inevitable push-pull current component which is known from the PG-PMD.

Preferably additional insulated and modulated metal electrodes ME of suitable width are used by way of the readout electrodes A and/or by way of the modulation electrodes M, preferably in the case of the OEP structures on a semiconductor basis, which are advantageous in many respects: 1) screening of signal waves, which is operative in the edge regions of the electrodes, prevents there a charge carrier pair formation effect which is not sufficiently used at high frequencies because of the further distances involved and reduces the modulation contrast; 2) the screening metal electrodes ME of the modulation electrodes are operated by way of suitable capacitive coupling for promoting modulation penetration with preferably approximately the same or an increased amplitude in respect of the modulation signal UM and preferably at the same or a displaced DC potential; 3) if a respective readout electrode A is disposed between two modulation electrodes M which are modulated in the same direction, then their screening metal electrode ME is preferably modulated by way of a suitable capacitive coupling to promote modulation penetration with preferably approximately the same or a smaller amplitude in respect of the modulation signal UM but of opposite polarity and preferably operated on the same or a displaced DC potential.

The OEP method according to the invention and the apparatuses for carrying it into effect permit inter alia multi-pixel sampling operation preferably of optical signal waves in which all OEP pixels are initially in the modulation condition zero MZ0. The two output currents controllable by UMa and UMb, per OEP pixel, each afford the output value zero (modulation condition MZ0) due to mutual compensation—irrespective of whether by way of ±current summing in accordance with wired-Or readout or by (++) or (−−)-difference current readouts at the output of the readout unit. Sampling of a 3D pixel of the spatial signal wave is effected by short-term implementation of the compensation condition MZ0 in the direction of a positively or negatively selectable sampling sample by way of MZP or MZN respectively. That sampling operation which is made possible in accordance with the OEP principle affords many advantages, for example for 3D detection of spatial scenes in particular with pulse radar methods which cannot be meaningfully implemented with the 3D-PMD camera. The inherently possible OEP sampling operation which can be easily implemented permits a 3D-OEP camera with very short measurement times at high pulsed peak power levels and relatively great measurement intervals. At the same time all the known advantages of PMD technology in respect of "correlated balanced sampling" and "non-correlated suppression" are retained if the so-called differential sampling procedure described hereinafter is used.

In the case of the MSM-OEP and comparable OEP structures suppression of an optical direct component, for example sunlight, is effected by virtue of the fact that the associated readout current, with the same duration in respect of the positive modulation or sampling conditions MZP and the negative modulation or sampling conditions MZN, flows forward and back in the same proportions as long as the modulation signal does not have a direct component. That background light suppression is effected without any additional circuitry complication and expenditure.

In the case of the OEP principle according to the invention, from at least one signal source PQ at least one signal wave impinges on the article which is sensitive in particular in relation to photons and electrons, preferably on a regular strip structure of Schottky or PN junctions on a signal wave-sensitive region of a low-doped p- or n-substrate 3 and generates charge carriers.

In the case of the OEP method based on the MSM technology, preferably strip-shaped Schottky diodes form in the simplest configuration a finger structure consisting of two groups of modulation electrodes Ma and Mb and at least one group of readout electrodes A. For a high band width or switching speed the strip widths are for example only about 1 µm wide and the photosensitive strips therebetween are only approximately double the width.

The MSM-OEP structure and the corresponding pn structure, similarly to the ME-PMD, are preferably provided on potential-free $n^-$- or $p^-$-substrate or potential-free $n^-$- or $p^-$-epitaxy layer or in silicone ON insulator (SOI).

To reduce the dark current of the Schottky junctions the readout electrode n is advantageously in the form of double strips which are as narrow as possible.

In the pn-implementation, for the $p^-/n^-$-substrate preferably a cut-off voltage is applied between the $n^+$ and $p^+$ electrode strips respectively and the oppositely disposed anode and cathode respectively. It is also advantageous to use pn diodes in a pip-OEP or nin-OEP structure instead of Schottky diodes in the MSM-OEP structure. For that purpose the photosensitive $n^-$ or $p^-$-region of the finger structure should form a floating well with low residual currents.

In addition the $p^+$ and $n^+$-electrode strips are preferably covered in insulated fashion by a metal electrode, on the one hand in order to avoid charge generation, which cannot be used, in the edge region, and in order to promote modulation by a strong drift field. That is achieved by optimising the width of the metal electrode, an offset voltage between the readout electrode A and the metal electrode for effective charge transport and a preferably capacitive coupling in relation to the modulation signal.

In a further configuration of the invention the sensitivity of the OEP can be increased by avalanche semiconductor structures in the OEP and by secondary electron multiplication.

The latter can be effected for example by upstream connection of a photocathode and a micro-channel plate and preferably subsequent direct OEP readout in vacuum by means of an anode matrix or with a CCD or CMOS pixel array. In accordance with the invention in that respect further amplification is used—even without connecting the micro-channel plate at an upstream location—which involves the high ionisation effect or quantum efficiency of accelerated high-energy photoelectrons and which can be a multiple of the usual photocurrent, for example up to a factor of 1000.

The base sequence of the electrodes Ma-A-Mb-A is the highest form of interleaving and is advantageous if the signal wave-sensitive article for example comprises a semiconductor material without pn junctions, for example photoresistor material. A lesser degree of interleaving can also be advantageous, for example with the electrode sequence Ma-A-Ma-A-Ma-A-Mb-A-Mb-A-Mb-A and so forth. Depending on the respective dopings of a pn-OEP structure, it is advantageous to use the readout electrodes between Ma and Mb differently, for example for potential adjustment. Depending on the respective desired OEP form, the sequence is continued by a multiple and is adapted in respect of the strip length. The interleaving of the UMa and UMb control regions may also extend to the orthogonal dimension, but should satisfy the 50%/50% signal wave distribution of P(t), which is wanted for the zero condition, or could be adjusted for example by calibration by way of the modulation voltage amplitudes. At least two modulation signals UMa and UMb modulate transport of the charge carrier pairs and thus determine the readout sum current IAS of the readout electrodes A, which is passed by way of the readout terminal AK to the readout unit VAEH and to a signal and data processing system SDV for further processing and evaluation.

With that simplest form of the OEP structure it is possible in accordance with the invention for the readout current to be steadily or dynamically rapidly controlled over the entire actuation range of the photocurrent IA of $IA_{min}$ to $IA_{max}=-IA_{min}$ by a procedure whereby the two modulation voltages UMa and UMb assume corresponding OEP-related voltage conditions. In particular the OEP permits the readout current to be switched over extremely quickly from $I_{max}$ to 0 or $I_{min}$. The desired switching of those three modulation conditions represents a key function for many applications and novel problem solutions. In the case of simple current summing or wired-Or current readout in the positive modulation condition MZP, with S as photosensitive sensitivity, IA=+SxP applies in idealised manner for MZP (UMaP, UMbP), wherein UMaP and UMbP represent the associated optimised positive modulation voltages. A corresponding consideration applies in respect of the modulation condition MZN with IA=−SxP for MZN (UMaN, UMbN) and for the modulation condition MZ0 with IA=0 for MZ0 (UMa0, UMb0) or approximately (UMaP, UMbN) or (UMaN, UMbP).

Enlarged functionality and flexibility is achieved with the double or twin OEP. For that purpose two single OEPs form a for example round or rectangular receiving surface which is divided into at least two equal parts OEP1 and OEP2, wherein the power of a signal wave P(t) is equally distributed to the OEPs or each OEP receives its own signal wave $P_1(t)$ and $P_2(t)$. The twin OEP can advantageously also be used at the same time as a single OEP for a signal wave P(t) which is distributed equally to OEP1 and OEP2. The two associated readout currents IA1 and IA2 are preferably directly brought together and read out at the wired-OR output AKS as an output sum current IAS. To achieve the three clearly defined modulation conditions once again suitable uniquely matched voltage conditions of the four modulation voltages UMa1, UMb1, UMa2, UMb2 are ascertained and respectively switched by the modulation source MQ. In the modulation condition MZP with S as sensitivity and an idealised quantum efficiency of 100% the following applies for the readout current sum IAS=IA1+IA2=+SxP1+SxP2 with MZP (UMa1P, UMb1P, UMa2P, UMb2P) and correspondingly for the modulation condition MZN IAS=IA1+IA2=−SxP1−SxP2 with MZN (UMa1N, UMb1N, UMa2N, UMb2N) and correspondingly for the modulation condition MZ0 IAS=IA1+IA2=−SxP1+SxP2 or +SxP1−SxP2=0 with MZ0 (UMa1P, UMb1N, UMa2P, UMb2N). It is also advantageous to use the zero conditions MZ0 (MZa1P, MZb1P, MZa2N, MZb2N) and MZ0 (MZa1N, MZb1N, MZa2P, MZb2P).

Asymmetries in the makeup of the finger structure can be ascertained by suitable measurement procedures and eliminated by compensating adjustment or in the feedback process, for example by correction of the modulation conditions.

Particular advantages are afforded by a configuration in the form of a quadruple OEP, preferably a four-quadrant form or a four-sector circular form which can be operated in many different ways. In regard to distance measurement for example a plurality of flexibly adaptable modes of operation are a possibility. A signal wave is distributed uniformly to OEP1 to OEP4. Thus for example besides the four individual distances it is also possible to determine the normal vector and the mean spacing of that surface element. At the same time that affords a certain degree of safeguard against incorrect measurements.

In a further configuration of the invention the OEP principle can be used for scanning repetitively occurring signal waves.

In the OEP sampling oscilloscope, in a similar manner to the known electrical sampling oscilloscope, preferably in a four-channel mode, a preferably repetitive spatial signal wave, preferably in time-synchronous manner and in spatial parallel relationship, is sampled by an OEP matrix sample by sample and reconstructed in relation to space and time in a downstream-disposed signal and data processing system SDV.

The sampling operation is effected by short-term switching-over of the single OEP or the twin OEP from the rest condition MZ0 into the sampling condition MZP with a positively weighted sample or into the sampling condition MZN with a negatively weighted sample with a sufficiently equally distributed power in respect of the signal wave pixel to the partial OEPs. Impression of the sampling pulse by means of a pair of modulation voltages is preferably effected by way of CR high pass members.

Offset errors and noise can be substantially compensated by a combination of positive and negative samples and the signs thereof.

In an embodiment of the OEP sampling method, in addition to the sampling of amplitudes, difference amplitude samples are also selectively sampled. For that purpose after MZ0 for a short time by virtue of the modulation condition MZP firstly a first negative sample $Q_{1-}$ and directly thereupon a second positive sample $Q_{2+}$ of the same sampling duration, in the modulation condition MZN, are taken from the signal wave current IA.

As in the subsequent modulation condition MZ0 the two samples are superimposed, the difference of the two charges $Q_{1-}+Q_{2+}=\Delta Q$ corresponds to the positive gradient sampling of the signal configuration and represents a novel differential sampling method by means of OEP. Interchange of the sequence $Q_{1+}+Q_{2-}=-\Delta Q$ affords negative gradient sampling which can advantageously be combined with the positive one in order to avoid error influences, for example symmetry errors.

With an OEP sampling oscilloscope of that kind it is possible with an OEP line or OEP matrix for dynamic spatial signal waves to be sampled in respect of space and time in accordance with the OEP principle and measured, wherein the Schottky-OEP technology and a SiGe-OEP technology lead to the expectation of band widths of far above 10 GHz.

This multi-OEP sampling method also makes it possible to record spatial images and fast spatial movements on the basis of the radar principle for repetitive pulse irradiation in the form of a 3D-OEP camera or an OEP stroboscope.

In a similar fashion, similarly to the known digital storage oscilloscope (DSO), a corresponding multi-OEP DSO can be implemented on the basis of the OEP principle for measuring unique signal waves, wherein the electrical sample-hold circuit used therein is replaced by at least one OEP sample-hold circuit. The use of an OEP line or OEP matrix comprising single or twin or quadruple OEPs means that signal waves can be measured in respect of space and time and digitally stored by way of the downstream-disposed analog-digital converter. In that case by virtue of subdivision of an OEP pixel into for example 4 or 9 or 16 partial OEP pixels for the same signal wave pixel, said OEP pixel is operated cyclically in succession as a 1:4, 1:9 or 1:16 demultiplexer and the high converter rate is reduced by those factors and thus analog-digital conversion is first made possible or the costs of extremely fast AD-conversion are substantially reduced.

In that respect inherently differential sampling is also advantageous by virtue of the high switching speed in particular of the MSM-OEP. In that case, instead of only one respective sampling sample, two samples of opposite signs are taken in immediate succession from the signal wave, in accordance with the OEP sampling principle, and superimposed and stored, preferably on a capacitor in relation to earth or in the feedback branch of a Miller integrator. Thereafter the difference value produced in that way is held for a short time for transmission to the downstream-disposed signal processing means, for example an analog-digital converter, and thereupon set to zero with a reset signal. That process of the corresponding differential OEP sample-hold circuit is pursued in quick succession, whereby 4/9/16-times subdivision of the OEP pixel means that suitable demultiplexing of the equally distributed signal wave pixel can further increase the sampling rate.

In that way a fast-modulated signal wave can be used as an optical time multiplex signal by virtue of sequential sampling of the equally distributed signal wave by an OEP matrix or an OEP pixel array, for example on the basis of the OEP parallel sampler as an OEP demultiplexers DEMUX which distributes the multiplex signal into slower parallel electronic or optical channels. In accordance with the invention an OEP matrix can also be used as the OEP multiplexer MUX. For that purpose a plurality of parallel optical signal waves are cyclically sampled by way of an OEP matrix in time-space succession and serially transmitted as current or voltage values or by way of a direct EO conversion procedure by means of an LED or laser diode as optical values in time multiplex manner. OEP pixel arrays according to the invention, as an OEP multiplexer MUX, can convert optically parallel channels of space multiplex signals into faster time multiplex signals with a smaller number of channels.

A combination of an OEP demultiplexer with many optical input channels which are superimposed in code, time, phase and space multiplex procedures, with an OEP matrix according to the invention as a code-, time-, phase- and space-selective OEP receiver and an OEP multiplexer can advantageously be used for OE routing in respect of an OEP router with spatial TDMA- and CDMA-technology combined in that way. For that purpose, in time multiplex or code multiplex operation or in hybrid time and code multiplex operation of an array of signal sources SQ, for example an array of incoming signal waves P(t) which as uniformly distributedly as possible irradiate a matrix of single or twin OEPs for example by way of a refractive or diffractive optical system, the procedure involves switching through by the router or cross-connect control preferably selectively and optionally on the basis of identical transmitting and receiving times and/or identical coding and phase.

Selective optional OE-switching or connection of many parallel input channels, for example an array of optical fibre inputs or an LED or VCSEL array to an OEP array with initially electronic and subsequently selectively optical output channels can be effected by means of free-space propagation over relatively large distances and by way of reflection phenomena in respect of the respective spatial boundary for example in an office room, a vehicle compartment, a housing space or in a preferably optically transparent or semi-transparent carrier plate (optical backplane). In that case, optional selection and switching can be effected for example in a code multiplex and/or time multiplex and/or frequency multiplex procedure between all possible channels from a signal source array to all channels of an OEP receiving array.

A further configuration of the invention concerns the interlinking of the electrical and optical signals by logical gate and memory functions which having regard to their great variety can only be described by way of example herein. If for example two signal waves P1 and P2 are applied to a twin OEP—which can be expanded to a multiple of signal waves and twin OEPs—each with a respective wired-OR interlinking WOR in respect of the readout currents and a current readout by a current-voltage amplifier $V_R = U_{out}/IAS$ with the output $U_{out}$, a downstream-disposed absolute member ABS, preferably a fast emitter- or source-follower pair actuated in complementary relationship by $U_{out}$, with connected common output $IU_{out}I$ and a downstream-connected electrooptical converter for converting $IU_{out}I$ into $P_{out}$, preferably an LED or laser diode, which can be integrated preferably directly for example on a GaAS- or GaInASP-OEP structure, that affords the following possible options in regard to signal interlinking:

The logic properties can be flexibly altered by switching over the three modulation conditions. For the modulation conditions MZP for P1 and MZN for P2 or vice-versa, that gives the following logical function table in which ternary conditions can advantageously also be used, but which here are to be considered only in respect of a binary logic and for the output $IU_{out}I$ and $P_{out}$ produce direct optical OEP-XOR interlinking of P1 and P2:

TABLE 1

| | OEP-XOR gate | | | |
|---|---|---|---|---|
| | P1 | P2 | Uout | IUoutI/Pout |
| For MZP/MZN | 0 | 0 | 0 | 0 |
| or for MZN/ | 1 | 0 | 1 | 1 |
| MZP | 0 | 1 | −1 | 1 |
| | 1 | 1 | 0 | 0 |

This OEP logic structure can be switched over relatively easily, flexibly and extremely quickly in respect of its function, for example by the modulation conditions MZP for P1 and P2 into an OEP-OR gate function corresponding to the following truth table, in which case binary logic is considered here and the options according to the invention in regard to use of the ternary conditions are not further considered:

TABLE 2

| | OEP-OR gate | | | |
|---|---|---|---|---|
| | P1 | P2 | Uout | IUoutI/Pout |
| For MZP/MZP | 0 | 0 | 0 | 0 |
| | 1 | 0 | 1 | 1 |
| | 0 | 1 | 1 | 1 |
| | 1 | 1 | 2(^1) | 2(^1) |

For the modulation conditions MZN/MZN for the two pairs of modulation voltages of the partial OEPs, that gives by virtue of negation from the OR sequence [0,1,1,1] a corresponding NOR sequence [1,0,0,0] or for $\overline{P1}$ and $\overline{P2}$ a NAND relationship.

The respective last positions of the two Tables 1 and 2 at bottom right afford the possibility of purely optical fast read-out of electrical logical conditions, for example from a data memory. The condition to be called up, for example "Low"=negative and "High"=positive voltage is applied to the modulation electrodes M2a/b and can be read off from the optical reply message Pout=Low or High corresponding to UM2a/b=positive or negative when P1 and P2 are both "High", that is to say when both are switched on and UM1a/b is constantly positive. In a similar manner, with this described logical structure—simplified and considered without data security measures—data can be extremely rapidly inputted optically into a memory and written by way of Uout—possibly with clock derivation from the P1-valid signal—for example into a flip-flop as for example with P1—High and "Valid", with UM1a/b=positive and with UM2a/b=negative the P2-condition Low/High is passed directly to the output Uout.

The large number of possible uses of the listed logic applications means that particular significance is attributed to the XOR gate in connection with phase regulating circuits, in particular the delay locked loop DLL.

The OEP-XOR gate according to the invention affords completely new options in optical systems for example as extremely fast digital incoherent opto-opto mixers for incoherent optical-optical PLL and DLL, in particular in digital phase regulating circuits.

OEP logic structures are particularly suitable for the OE interface region. Further processing steps for example with flip-flop structures are at the moment much more economical in conventional manner.

In accordance with the invention however there is the possibility, by suitable expansion of that OEP-OR gate circuit with simple or mutual electrical and/or optical feedback, to embody fast, optical OEP flip-flop circuits OEP-FF in the various known variations of ohmic and/or capacitive feedback in the form of a bistable (D-FF, JK-FF), monostable and astable flip-flop and as a Schmitt trigger. Examples of use in the low cost area are OE sensor systems, optical transmitters or displays and OE interfaces, in particular printable, optically writable and optically readable labels on a polymer electronic basis and an OLED basis.

In accordance with the invention, besides the fast switching options, besides the logical functions and mutual, partly fed-back interlinking options, the OEP permits extremely fast and mixing and correlation of signal waves, preferably optical signals with electrical signals.

In regard to digital modulation signals that mixing or correlation means that the pair of modulation voltages are switched in push-pull relationship between the modulation conditions MZP and MZN. In accordance with the invention single OEPs or twin OEPs are operated as a mixer and correlator of at least one pair of modulation voltages at at least one group of modulation electrodes and at least one preferably modulated signal wave $P=P_0+p(t)$ with a direct component $P_0$ and an alternating component $p(t)$.

In that case, in the ideal situation, the readout current is respectively modulated at 100% with $IA=IAo+I_A(t)$ and $IAS=IA1+IA2=IAS_0+I_{AS}(t)$ and symmetrically by the modulation voltages $UMa=UMao+u_{ma}(t)$ and $UMb=UMbo+u_{mb}(t)$ with preferably $u_{ma}(t)\equiv u_{mb}(t)$ and $UM1a=UM1_{ao}+u_{m1a}(t)$ respectively and $UM1b=UM1bo+u_{M1b}(t)$ with preferably $u_{m1a}(t)\equiv u_{m1b}(t)$ and $UM2a=UM2ao+u_{m2a}(t)$ and $UM2b=UM2bo+um2b(t)$, wherein symmetry adjustment of the readout currents IA1 and IA2 can be effected selectively in the optical region and the OEP can be operated in accordance with the modulation, preferably between the modulation conditions MZP, with positive readout current, and MZN, with negative readout current.

With the twin OEP, for example with wired-OR current readout, the degree of modulation of the readout current of the signal wave, preferably with equally distributed intensity distribution to the partial OEP1 and the partial OEP2, of the maximum value of 100%, with IAS=IA1+IA2 and with IA1=IA2, can be reduced by opposite asymmetry of the pulse duty factors of MZP1/MZN1 and MZP2/MZN2 respectively linearly to 0%, which corresponds to the modulation-less zero condition MZP1/MZN2 or MZN1/MZP2 and thus in the total the zero condition MZ0.

In respect of difference readout of the readout unit for the maximum value both partial OEPs are modulated in phase-opposition relationship and complementary relationship respectively with MZN/MZP.

For evaluation of the mixed product being sought the interlinking and evaluation unit VAEH preferably has selection and filter properties, for example in the frequency band for a given mixing frequency. The mixing process is used in many applications such as in the OE lock-in amplifier, the OE phase regulating circuit (OE-PLL), in transit time measurement of laser radars, combined with short-term integration and thus correlation, and as an OE frequency converter. For the correlation result the mixed product is ascertained in the base band, preferably by short-term integration, preferably by a Miller integrator with reset switches.

A particular advantage of the OEP mixer and OEP correlator lies in the possibility of rapidly switching over the modulation signals and modulation conditions by a correspondingly fast modulation source MQ.

In particular the possibility of time multiplex operation and burst operation due to fast complete switching of the readout current on and off into the zero condition MZ0 are advantageous.

The use of the new OEP correlator is advantageously implemented in optical information transmission, for example in diffuse free-space communication in halls and rooms but also in relatively small apparatus housings, in the general and microsystem-technical optical connecting art and so-called optical backplanes as a multilayer wiring supplement and in line-bound optical networks, for example polymer fibre LANs in the automotive sector. In that respect a relatively high band width or bit rate is made possible at the output by means of the MSM-OEP.

The relatively low-ohmic input of the readout circuit and the low degree of crosstalk of the modulation signal by way of the small barrier layer capacitances for example of the MSM structures permit short integration times and thus high bit rates.

By virtue of code, phase and time multiplex operation (CDMS and TDMA) and further multiplex methods in such a network the number of channels can be increased for example to over 100 by virtue of the particular properties of correlated and non-correlated balanced sampling, in the receiving nodes. The reason lies in almost complete suppression of such signal waves which do not correlate with the modulation signal.

In a further configuration of the method according to the invention, for unknown signal waves, the correlation process is achieved with suitable modulation signals in respect of the OEP, in that the signal wave is effected first by suitable modulation immediately prior to passing into the OEP receiving device by an additional modulation device which is preferably integrated into the OEP system and the modulation of which is in a given relationship with that of the OEP.

The purpose is for example highly sensitive and inexpensive detection of thermal images. Conventional thermal imaging cameras operate approximately in the 3–10 μm wavelength range with correspondingly suitable semiconductor materials and for example cooling with liquid nitrogen to suppress the severe heat noise of the detector.

Besides being embodied in fast MSM technology, depending on the respective spectral aim involved, the simple structure of the OEP pixel according to the invention can be embodied by many semiconductor materials and technologies, for example in Si-bipolar technology (the preferably metallic strip structures in that case cover for example $n^+$-cathode strips over $p^-$-silicon. For the far infrared range and for the thermal radiation range it is possible to use for example indium-antimonide InSb and HgCdTe. As the dark currents are substantially suppressed for example by rectangular modulation between the conditions MZP and MZN by the effect of correlated balanced sampling (CBS), high levels of sensitivity are achieved even without the usual costly cooling. For that purpose, when recording an image, the incident signal wave is subjected to rectangular modulation at the clock of the modulation process, for example by a rotating chopper disc or by an array of micromirrors (digital mirror devices), at the same phase and frequency.

OEP receiver materials for the heat radiation range make it possible to provide an OEP heat radiation radar, with modulatable heat radiators, for example quantum cascade lasers (QCL).

A further configuration of the invention provides a method of increasing the sensitivity of the OEP receiving device and an apparatus for carrying out that method.

Besides the known and discussed possible ways of increasing the level of sensitivity such as spectral filtration of the signal wave, correlated balanced sampling and so forth, it is also possible to connect upstream of the OEP receiving surface which preferably comprises an OEP line or an OEP matrix, an image amplifier unit for amplifying the intensity and/or for spectral transformation of the signal wave.

The method according to the invention provides that the signal wave is firstly transformed in its spatial cross-section of a photon current by preferably a photocathode directly or indirectly for example by way of a scintillator layer for the X-ray range, into a corresponding cross-section of an electron current.

In the vacuum the OEP surface structure is preferably disposed directly opposite the photocathode surface as a parallel surface and at the same time at a positive anode potential. Thus, the photoelectrons triggered by the signal wave, on the vacuum side of the photocathode, experience an acceleration effect corresponding to the potential difference, defined by $U_A$, of for example 10 to 1000 volts, which can be controlled or regulated in a simple fashion. The ionisation effect and the formation of charge carrier pairs in the sensitive region 3 is boosted by the increased energy of the impinging electrons of $eU_A$ almost by a corresponding amount. In that case the mode of operation of the OEP principle is extended from a signal wave of preferably photons to accelerated electrons or beta-rays.

The extremely high level of sensitivity which can be achieved in that way, with at the same time a high degree of suppression of non-correlated signal waves, permits many different measuring methods, for example improved infrared and X-ray tomography in the medical art, in which respect the high time resolution of the OEP array permits its own or combined transit time tomography by way of fast infrared source or X-ray source modulation.

In a further configuration of the invention the level of OEP sensitivity can be further increased by an electron multiplication procedure which is implemented between the photocathode and the OEP receiving surface.

For that purpose there is provided for example an array of photomultipliers, preferably a micro-channel plate MCP, preferably of the same surface profile as the photocathode and the OEP receiving surface, the OEP-structured front side metalisation of which is at a first anode potential. A second anode potential in relation to the first on the rear of the micro-channel plate accelerates the electrons within the micro-channels by an MCP voltage of for example 1000 volts, thereby achieving secondary electron multiplication with an approximately 1000-times current amplification effect. The surface structure of the OEP is at a third anode potential of for example 10–>1000V and can thus contribute to further regulatable amplification by the photoelectron energy with an up to 1000 times current amplification effect.

Such an OEP infrared image amplifier or OEP X-ray image amplifier, in an extremely small space, achieves extreme amplification effects with the advantage of time selection and interference radiation suppression. In the form of modulated OEP-3D image amplifier cameras it is possible in accordance with the invention in that way to achieve ranges in the kilometre region, for example with possible applications in air data measurement and in air, space and sea travel.

In a further configuration of the invention distance measurement on the basis of the laser radar principle can advantageously be combined with lateral speed measurement in an integrated mode of operation and as an integrated apparatus.

In that case an OEP array operates temporarily in the mode of a pixel-wise or spatially parallel correlation receiving arrangement in the time domain and temporarily in the mode of a time-parallel correlation receiving arrangement in the position domain. The former is optimally suited to distance measurement and the first derivative thereof, the orthogonal speed measurement $v_{rad}$ by way of the echo transit time of a surface backscattering the signal wave and the latter is optimally suited for per se known lateral speed measurement $v_{lat}(v_x, v_y)$ of that surface.

The time correlation per OEP pixel implements for the incident signal wave filtering and measurement in the time and frequency domain and, with a known speed of propagation, the pixel depth.

In accordance with the invention the OEP matrix implements lateral spatial correlation for example for the incident signal wave of a random ground image with a test pattern or weighting pattern of constant MZP and MZN conditions or filtering and measurement in the position domain and in the position frequency domain in successive steps. In that respect the signal wave of the ground image P(x,y) or the 2D-Fourier transform P $(f_x, f_y)$ thereof at the time ti is correlated with the weighting G(x,y) of a test pattern, for example by a regular OEP matrix in the position domain with P(x,y)**G(-x,-y) or multiplied in the position frequency domain by the 2D-Fourier transform in accordance with P $(f_x, f_y) \times G^*(f_x, f_y)$.

In accordance with the invention both options are proposed with the same OEP array by switching over the OEP functions and specific evaluation and can be combined in a "motion-over-ground" OEP sensor, as is of great significance for example for safety in road traffic.

For example based on an OEP matrix, three modes of operation are implemented: 1) that of an OEP 3D camera with spatial depth measurement as described in numerous publications relating to the PMD-3D camera and as can advantageously be embodied with the 3D-OEP camera; 2) that of a regulated, situation-governed zero circuit for burst operation which is optimised from the point of view of power economy; and 3) vectorial lateral speed measurement.

Regarding the third mode of operation, the basic starting point adopted is initially for example an OEP strip pattern transversely with respect to the direction of travel x or a strip pattern perpendicularly thereto or an OEP chessboard pattern as test patterns in which for example all light strips or areas in the MZP condition furnish an associated positive photocurrent while the dark areas in the MZN condition furnish a negative photocurrent. The readout currents are combined in push-pull relationship in respect of the speed direction to be measured, divided for two directions in the OEP chessboard pattern. Filtering is effected in accordance with its representation on a surface in the form of a two-dimensional position filter or position frequency filter with the imaged OEP edge length Dx and Dy as half the pattern period and the corresponding position frequencies $f_{Dx}=\frac{1}{2}Dx$ and $f_{Dy}=\frac{1}{2}Dy$ in regard to the detected ground image in respect of the $f_{Dx}$ and $f_{Dy}$ spectral components. Without lateral movement the amplitude Ax and Ay respectively of the power densities is measured at those position frequencies.

In the case of a movement of the 3D-OEP camera in the lateral operating conditions for example over an illuminated ground the phase or amplitude changes in a light-dark alternation with the duration $T_t=2D/v$ and the time frequency $f_1=1/T_t$. That affords the speeds being sought as vectorial components of a lengthwise and transverse component of the speed of a vehicle:

$$v_x=2Dx/T_{tx}=f_{tx}/f_{Dx} \text{ and } v_y=2Dy/T_{ty}=f_{ty}/f_{Dy}$$

As the imaged edge length D of the OEP pixel depends on spacing, over the optical scale factor of the 3D camera, a distance measurement is additionally to be effected intermittently or at least with parts of the OEP matrix, and in accordance with the invention that can be effected in time multiplex mode sequentially or in space multiplex mode in parallel relationship.

In a further configuration of the invention it is proposed that OEP dual function sensors according to the invention of that kind are used in relation to vehicles, preferably in peripheral vehicle parts, in particular in the outside mirrors and in the case of heavy goods vehicles in bumpers—also for automatic speed-dependent damping regulation.

In regard to integration of that "motion-over-ground" OEP sensor, it at the same time also provides for monitoring of the respective side of the vehicle in question, in the form of a 3D ground camera.

The relatively large mirror surface and the volume of the outside mirror is proposed for at least one further rearwardly viewing 3D camera for monitoring traffic in the so-called blind spot and for a forwardly measuring 3D camera. Transmitting and receiving the signal waves of the "blind spot" 3D-OEP camera are effected preferably in the infrared range and desirably by the mirror surface which is transparent in the visible range.

In a further configuration of the invention there is proposed an OEP measuring method which is advantageously suitable for measuring specific transit times, in particular relaxation times, in the analysis of chemical and biological substances. The method in principle for OEP substance analysis and the apparatus for carrying out the method can be compared to the application of the OEP-3D camera. The materials, substances, and so forth to be analysed are irradiated modulated by the transmitter, preferably in sinusoidal form, and with at least one angular frequency ω which is suitable for the relaxation times which are to be investigated of given quantum transitions and in at least one spectral range λ which is suitable for excitation of those energy transitions. The material which is excited for example with $\lambda_{UV}$ in the ultraviolet range responds with the corresponding sinusoidal backscatter or transmission at ω which 1) depending on the respective fluorescence properties thereof can be delayed by the phase $\phi=\omega\tau$ or transit time τ in a wide range of femtoseconds to milliseconds and which 2) in other generally lower spectral ranges of the signal wave carrier experiences backscatter or which in the region of the given quantum transitions has spectral absorption regions or lines in respect of transmission.

One dimension of the OEP array preferably serves for imaging spectral decomposition of the backscattered or transmitted signal waves over λ and the other dimension serves for parallel measurement of many material samples, for example along a sample line.

The sought combination of spectral line and relaxation time $\tau=\phi/\omega$, with the OEP array, permits great advances in fast and precise substance analysis, in particular in time-resolved spectral analysis.

BRIEF DESCRIPTION OF THE DRAWING

Further advantages, features and possible uses of the present invention will be apparent from the description of preferred embodiments with reference to the Figures in which.

DETAILED DESCRIPTION OF THE PREFERRED EMBODIMENTS

Figure 1:
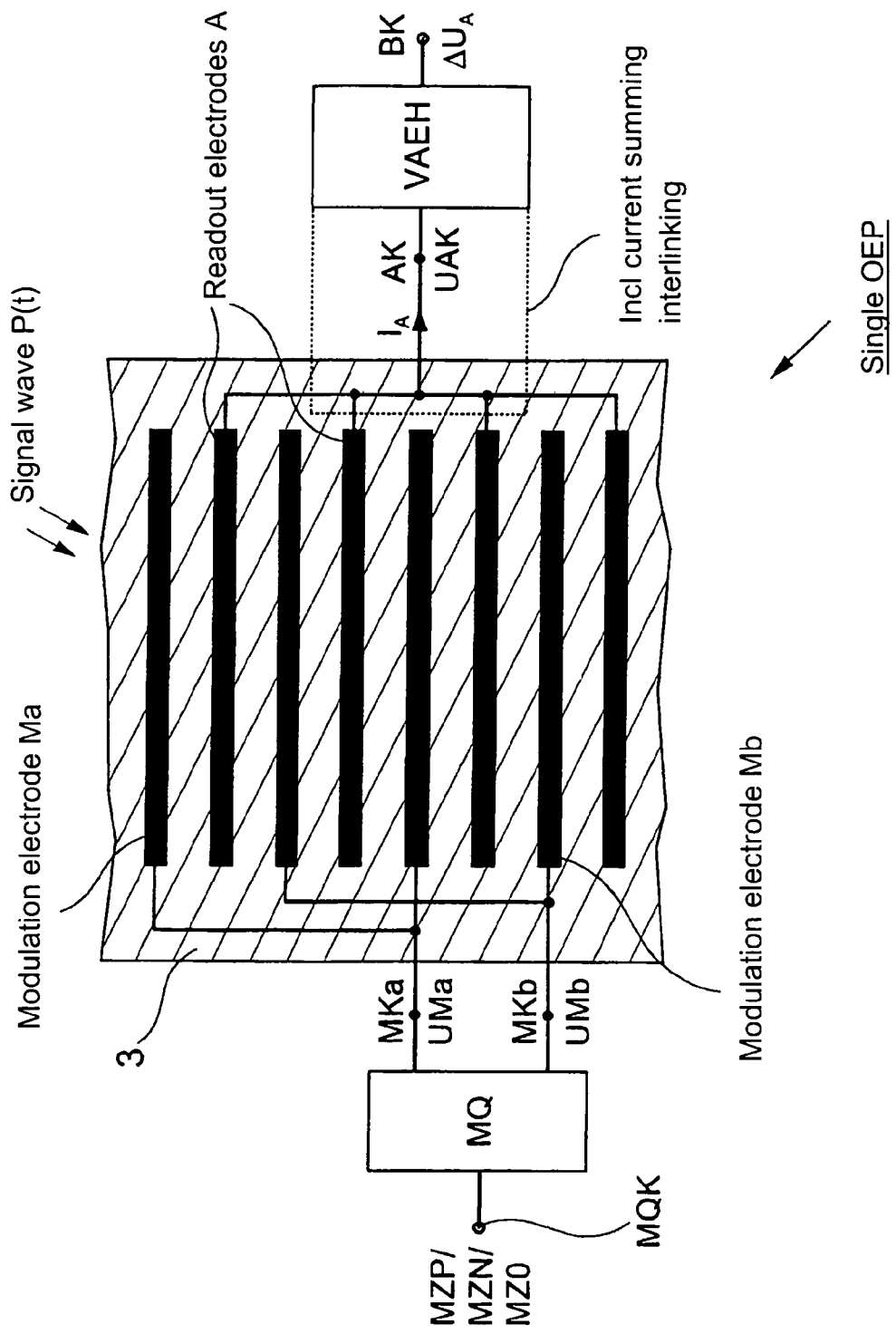
FIG. 1 shows a single OEP element comprising an interconnected group of readout electrodes and two respective interconnected groups of modulation electrodes.

FIG. 1 shows the surface of an article 3 which is sensitive to signal waves, with a regular covering of similar modulation electrodes Ma and Mb, between each of which are disposed the respective readout electrodes A. A signal wave P(t) which is distributed as equally as possible generates charge carriers in the modulation and readout region, identified in that way, between the electrodes. The modulation electrodes are modulated by the modulation source MQ at the terminals MKa and MKb with the associated modulation voltages UMa and UMb and thus influence distribution and the direction of the read-out charge carrier current IA at the readout terminal AK. The readout potential UAK is preferably selected to be zero or earth potential by means of a low-ohmic readout unit VAEH. Clearly defined modulation conditions which can be predetermined by way of the input terminal MQK of the modulation source MQ are firstly the condition, identified by MZP, with maximum positive current condition IAmax, secondly MZN with maximum negative current condition IAmin and thirdly the compensation or zero condition MZ0 with IA=0.

With this illustrated single OEP, a zero circuit in the modulation condition MZ0 with IA=0 is achieved in that asymmetries in the modulation voltages involves current equalisation between the readout electrodes which are short-circuitedly connected. Here, for reasons relating to the drawing, maximum interleaving of the two groups of modulation electrodes has been selected, but in practice that is not required with for example 50 to 100 strip electrodes.

In addition FIG. 1, by virtue of the broken-line expansion of the interlinking and the readout unit VAEH, makes it clear that, in the case of the single OEP, by means of current sum interlinking, an OEP-inherent interlinking of the various readout currents which can be influenced already takes place prior to further signal processing, on the OEP element.

Figure 2:
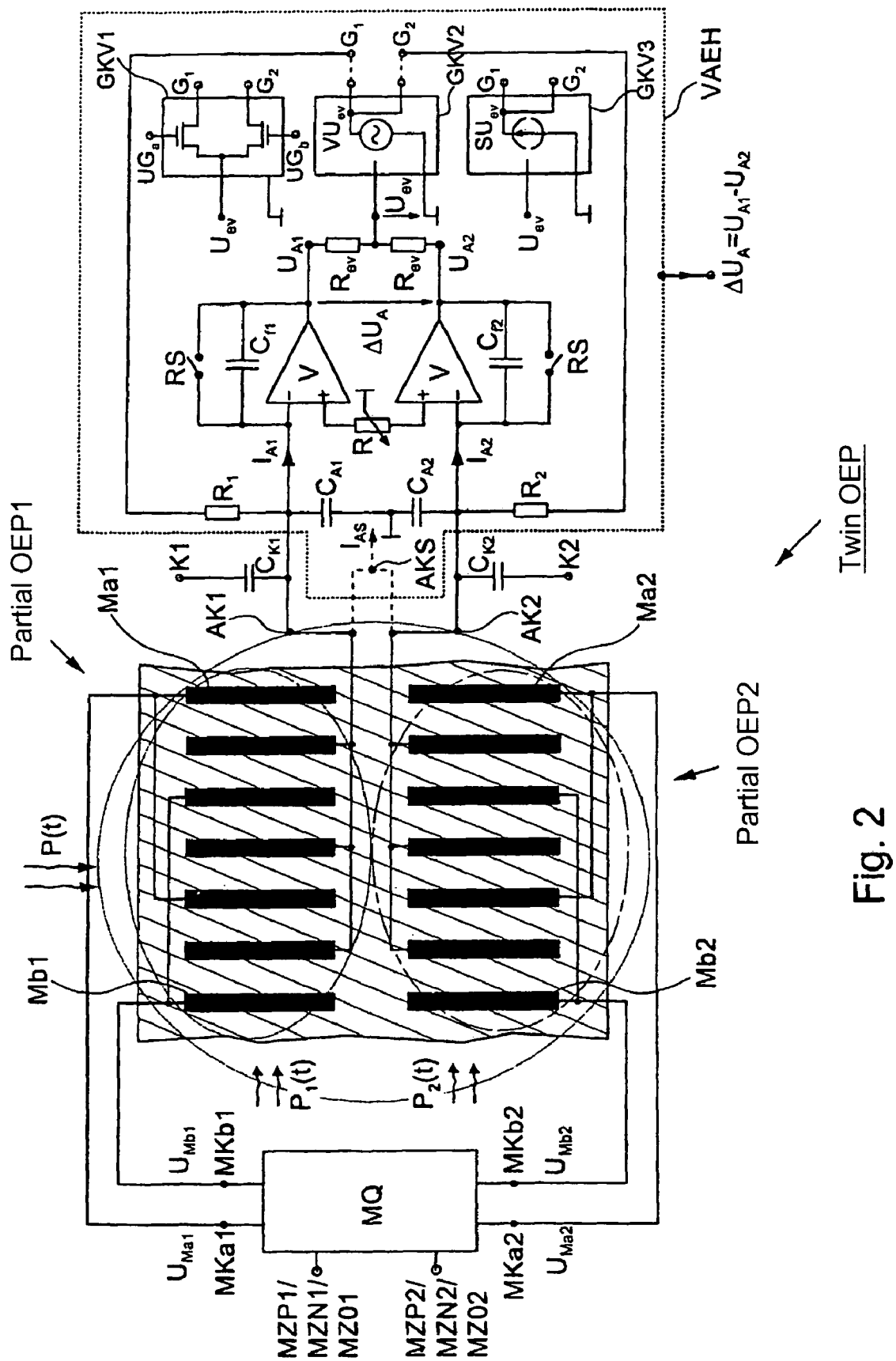
FIG. 2 is a diagrammatic representation of the twin OEP similarly to the single OEP in FIG. 1 but with a circuit configuration of a downstream-connected readout unit.

As shown in FIG. 2 the properties which in principle are the same can also be achieved with division of the OEP structure into two partial OEPs with the so-called twin OEP. In that respect, the basic starting point adopted is initially a single signal wave P(t) involving equally distributed power. The sum of the currents can be combined by a wired-OR circuit WOR at the corresponding readout terminal AKS. By virtue of modulation of the currents of the two partial OEPs 1 and 2 in the same or opposite directions, they can be controlled in the sum from Imax through zero to Imin.

The two currents IA1 and IA2 can also be read out separately from an interlinking and readout unit VAEH—as illustrated in FIG. 2 alternatively to the wired-OR readout WOR—by a difference Miller integrator with the two operational amplifiers V. That corresponds to the effect of subtraction of the currents and the result obtained is the zero condition MZ0 with the combination MZP1/MZP2 or MZN1/MZN2.

The common-mode components which inevitably occur in that situation charge the readout capacitors $C_{A1}$ and $C_{A2}$ and after the delay time of the operational amplifiers V, the Miller capacitors Cf1 and Cf2, in the same direction, without thereby involving the falsification of a push-pull output voltage $\Delta U_A$ which is of interest for evaluating for example the correlation function or logical interlinking of optical and electrical signals.

Steady conditions of that kind however can also result in common-mode overdriving of the circuit. They are avoided depending on the respective mode of operation of the OEP circuit cyclically by the reset switches RS of the Miller capacitors Cf1 and Cf2. Common-mode overdriving is securely and adequately avoided by the specified circuit according to the invention by way of the $R_{ev}$—$R_{ev}$ bridge circuit which only takes off the output-side common-mode component $U_{BV}$ and feeds it in in amplified form by way of R1 and R2 in feedback relationship and as a compensating current to the two amplifier inputs AK1 and AK2. In that feedback circuit amplification of the control parameter $U_{ev}$ and compensating symmetrical current feed-in at the terminals AK1 and AK2 can advantageously be effected 1) by way of a circuit GKV2, a controlled voltage source VUev, at the output terminals G1 and G2 or 2) by way of the circuit GKV3, a controlled current source $SU_{ev}$; 3) highly symmetrical feedback and current division can be effected by way of an FET differential amplifier as a gate-base amplifier GBV which is desirably microelectronically integrated in a very small space, saving on R1 and R2—advantageously with a current amplification effect which can be set by way of equal gate voltages UGa and UGb, by way of the internal resistance Rev/2 of the common-mode voltage source $U_{ev}$ and by way of the FET-gradients.

Capacitive crosstalk of the modulation signals to the readout electrodes can be compensated at the two terminals K1 and K2 by suitable push-pull signals at $C_{K1}$ and $C_{K2}$.

Figure 3:
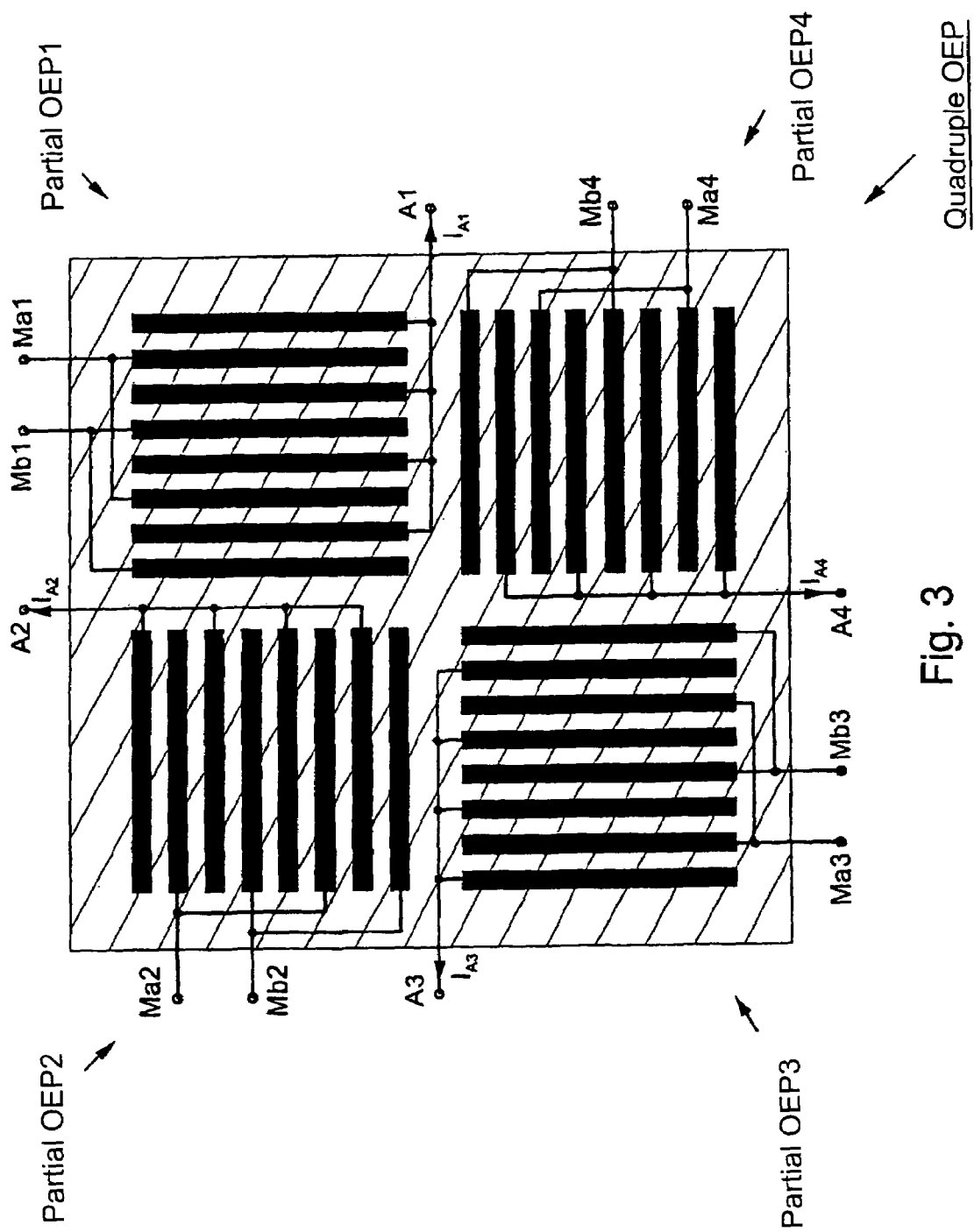
FIG. 3 shows a diagrammatic representation of the structure of the quadruple OEP in 4-quadrant form.

FIG. 3 diagrammatically shows a plan view of a quadruple OEP which can replace both the function of the single OEP and also that of the twin OEP and which flexibly serves for 4-times, 2-times and 1-time measurement. In addition the operation of determining the phase of a correlation function is implemented in one procedure by possible parallel measurement—for example IQ-measurement in the case of sine signals. The orthogonal orientation of the adjacent finger structures advantageously results in minimal crosstalk.

Figure 4:
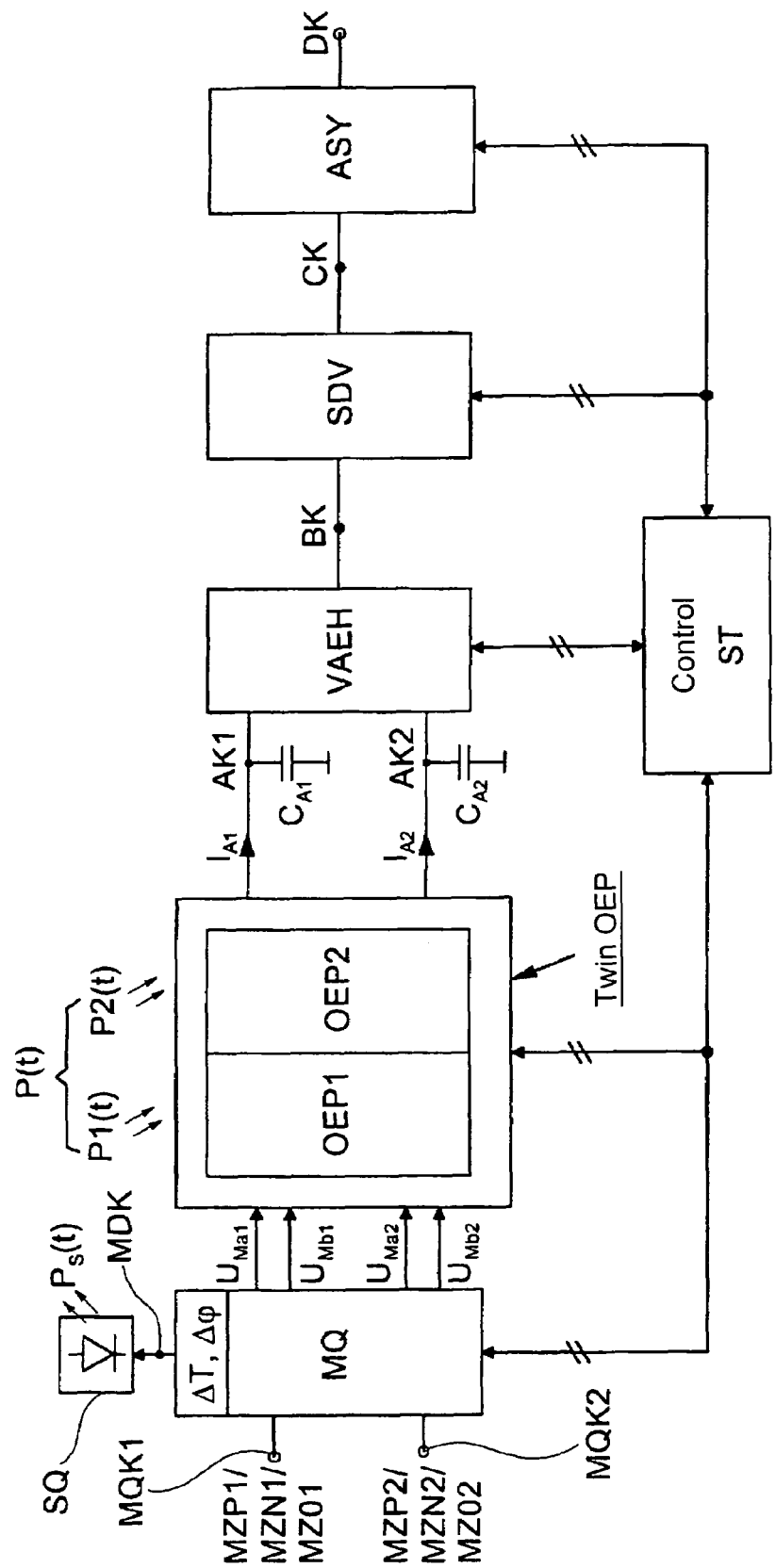
FIG. 4 shows a block circuit diagram of an OEP sensor system or a single communication system.

FIG. 4 is a block circuit diagram showing the structure of an OEP sensor system by means of the example of a twin OEP which is representative here of an OEP line or OEP matrix.

An optical signal source SQ is modulated by way of the modulation source MQ with a selectable delay $\Delta T$ or $\Delta \phi$ and emits the signal wave $P_s(t)$. For example in fluorescence spectroscopy it excites a sample or in the case of laser radar illuminates a 3D scene. The received signal wave P(t)=P1(t)+P2(t) is demodulated by suitable modulation voltages which are related to the signal source modulation. The processing/interlinking and evaluation units VAEH, signal and data processing system SDV and actuator system ASY follow. The control ST provides for matching and optimising the measuring procedures.

Figure 5:
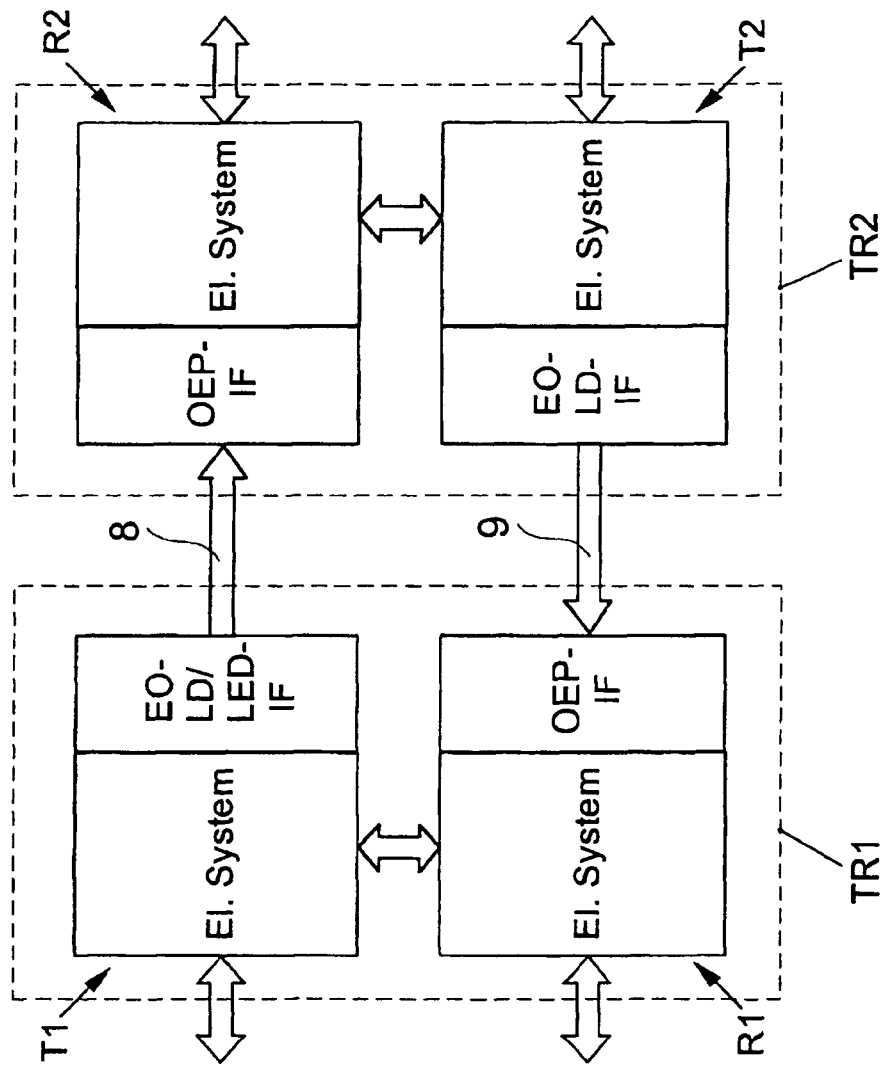
FIG. 5 shows the block circuit diagram of a complex OEP communication system in particular for free-space communication.

FIG. 5 diagrammatically shows the block circuit diagram for information exchange of two systems or network subscribers by way of OEP arrays and LED/laser diode arrays, in particular for new applications in the free-space communication, for example in space travel, within rooms, vehicles, items of equipment and in optically transparent circuit boards, but also in bidirectionally used local polymer fibre networks. A transmitter/receiver system TR1, by way of the electrooptical interface of the LEDs or laser diodes, by way of the beam path 8, sends data in encoded form, by way of predominantly diffuse scatter, to an OEP interface having a plurality of OEP receivers and a downstream-connected electronic system (EL system). Depending on the respective use the return channel goes directly by way of the transmitter T2 or by way of a local or wide-area network.

Figure 6:
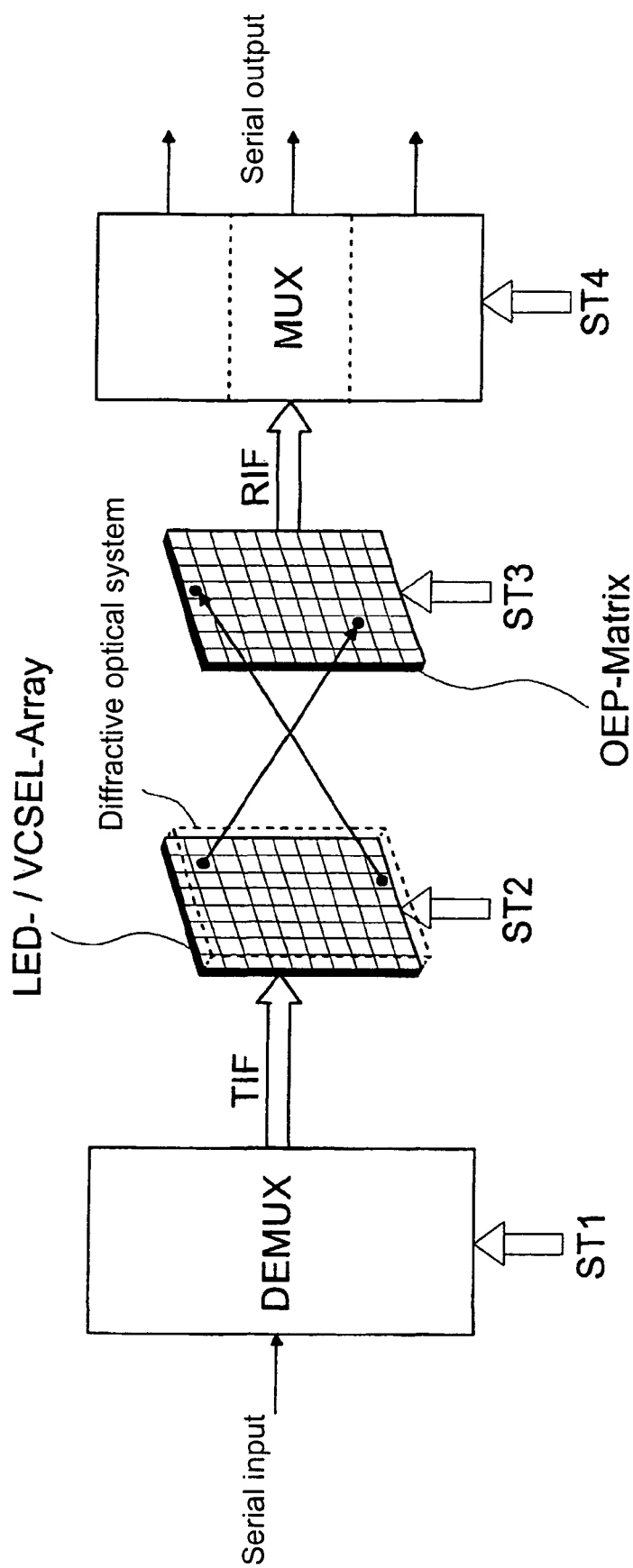
FIG. 6 shows the block circuit diagram of a router or an optical switching unit on an OEP basis.

FIG. 6 diagrammatically shows in the simplified form of a block circuit diagram a router controlled by way of the inputs ST1–4 or an optical switching unit (optical cross connect). The serial input data flow is passed by way of an input-side demultiplexer DEMUX and by way of a parallel transmitter interface ITF to an LED or laser diode or VCSEL array and further by way of a diffractive optical system for uniform power distribution to an OEP matrix. Association of the channels to be switched is implemented in code and time multiplex procedures. The parallel outputs of the OEP matrix go by way of the parallel receiver interface RIF to an output-side multiplexer MUX for predominantly serial output of the routed or switched data flows.

Figure 7:
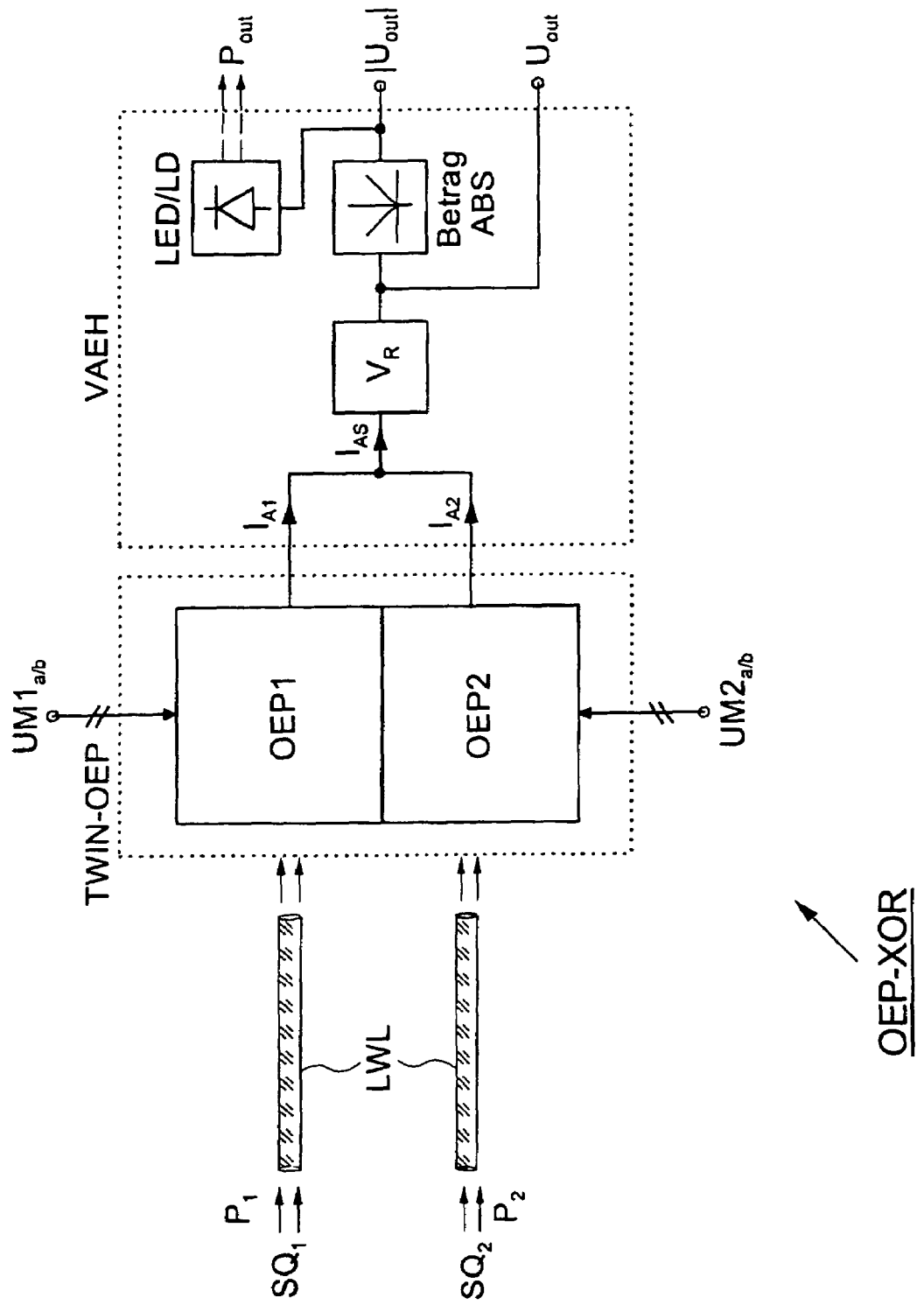
FIG. 7 shows an OEP interface component.

FIG. 7 diagrammatically shows a novel OEP logic component which is intended to demonstrate by way of example how an optical-electronic interface can both substantially increase speed and also substantially simplify structure.

Two signal sources SQ1 and SQ2 couple the signal waves P1 and P2 by way of optical wave guides LWL to the twin OEP with OEP1 and OEP2.

The output currents IA1 and IA2 are controlled by UM1a/b and UM2a/b and brought together to form $I_{AB}$. The current/voltage amplifier $V_R$ with positive gain and the output Uout is followed by an amount member ABS with $|U_{out}|$ and an LED/laser diode with $P_{out}$.

That simple OEP pattern circuit performs four functions:
1. P1 and P2 are logically interlinked by way of XOR in respect of $|U_{out}|$ and $P_{out}$ for the modulation conditions MZ1P/MZ1N.
2. P1 and P2 are interlined by way of OR for MZ1P/MZ2P.
3. With P1 and P2 "high" a logic condition UM2a/b can be very quickly read out purely optically as $P_{out}$.
4. With P1 "high" and the modulation condition UM1P/UM2N the P2 condition can be passed purely optically directly to $U_{out}$ and can be written for example into a memory.

Figure 8:
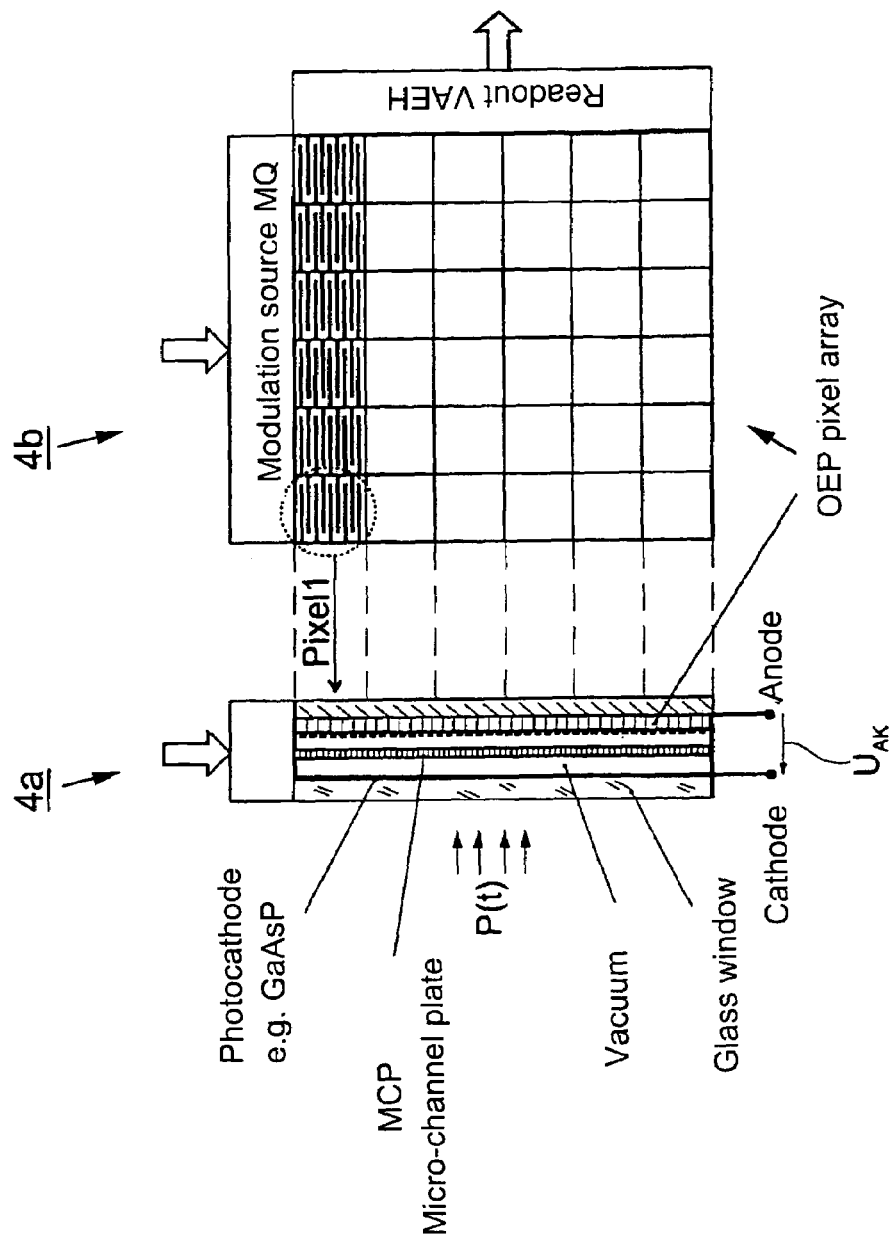
FIG. 8 shows an OEP structure for an extremely high level of sensitivity with image amplification.

FIG. 8 shows a possible way of increasing sensitivity of the OEP principle. In a first embodiment without the illustrated micro-channel plate MCP the OEP image amplifier comprises the left-side photocathode on which the signal wave P(t) impinges. On the vacuum side of the photocathode there is an image of the photon incidence as an electron issue. By virtue of a sufficiently positive voltage in respect of the OEP receiving surface which acts as a positive anode in relation to the cathode, the electrodes impinge with a correspondingly high level of energy eUA on the photosensitive region 3. That increase in energy results in a corresponding increase in the formation of pairs and thus an increase in the level of sensitivity.

By virtue of the insertion of a micro-channel plate MCP as illustrated the level of sensitivity can be further increased, with suitable operating voltages.

The right-hand part in FIG. 8 diagrammatically shows a view onto the pixel structure.

What is claimed is:

1. A method of detecting and/or processing signal waves which in an article sensitive to the signal waves produce charge carriers which induce a signal current in at least one readout electrode, wherein there are provided at least two modulation electrodes, at least one of which is arranged in spatial proximity with the at least one readout electrode and the other modulation electrode is arranged in spatial proximity either with the same readout electrode or a further readout electrode in such a way that in dependence on the sign of the modulation voltage of the respective modulation electrode the current flowing by way of the associated readout electrode is positive or negative, characterized in that the modulation electrodes are modulated with a voltage amplitude and/or phase relationship which can be freely selected relative to each other, wherein the readout currents produced by the modulation voltages of both modulation electrodes are additively coupled.

2. A method according to claim 1 characterized in that the spatial arrangement of the modulation electrodes relative to the readout electrodes and/or the voltage amplitudes of the modulation voltages are so selected that with opposite signs of the modulation voltages the added readout currents mutually cancel each other out.

3. A method according to claim 1 or claim 2 characterised in that one of the modulation voltages is a constant voltage while the other is of a freely selectably alternating sign.

4. A method according to one of claims 1 or 2 characterised in that the amplitudes of the modulation voltages are variable.

5. A method according to one of claims 1 or 2 characterised in that a plurality of different signal currents which are produced by different signal waves on separate elements are combined together, in particular added.

6. A method according to one of claims 1 or 2 wherein the signal waves are also modulated and modulations of the modulation electrodes are in well-defined relationship with the modulation of the signal waves.

7. A method according to claim 6 characterised in that the readout electrodes and the modulation electrodes are used as PMD elements insofar as both modulation electrodes experience in in-phase relationship a fast change in sign of the modulation voltage and the readout current is integrated over at least one such period.

8. A method according to claim 6 wherein the readout electrodes and modulation electrodes are operated by changing the phase and/or amplitude relationships of the modulation signals alternately or parallel as PMD elements and/or OEP elements, wherein preferably the OEP elements in an array which are operable selectively by spatially alternating modulation conditions MZP and MZN implement pattern analysis or position frequency analysis of signal waves.

9. A method according to one of claims 1 or 2 characterised in that the interlinking of readout signals of various readout electrodes includes in particular addition, subtraction or addition with variably adjustable phase relationship and logical interlinkings AND, OR, XOR and the negations thereof.

10. A method according to one of claims 1 or 2 characterised in that the optoelectronic processor OEP which preferably has a low level of substrate doping, by means of control by three matched modulation voltage conditions, provides three associated readout current conditions, a first modulation condition MZP (UMaP, UMbP) with a positive, preferably maximum readout current IAP, a second modulation condition MZN (UMaN, UMbN) with a negative, preferably minimum readout current IAN and a third modulation condition MZ0 (UMaP, UMbN) or MZ0 (UMaN, UMbP) respectively with a vanishing readout current IA0=0.

11. A method according to one of claims 1 or 2 characterised in that integration of the readout current IAS is effected and in which zero switching of the integrated readout current or the readout charge QS is effected in that, preferably after preceding zero switching of the charge QS, high-frequency symmetrical switching-over of the two modulation conditions MZP and MZN occurs.

12. A method according to one of claims 1 or 2 characterised in that the OEP strip structures have avalanche semiconductor structures, use ionisation effects of fast electrons or are connected to electron multipliers, in which in particular the charge carriers produced by the signal wave or the readout currents are amplified by multiplication, on the one hand by the avalanche effect by suitably biased pn- or Schottky junctions in the semiconductor substrate, wherein the modulation voltages are preferably regulated in respect of amplitude, further by upstream connection of a photocathode and by secondary electron multiplication of the photoelectrons in vacuum by means of micro-channel plates or photomultipliers, wherein either the electron image is firstly converted back into an optical image or is read out directly by the OEP structure, wherein in the latter case the secondary photoeffects of the high-energy electrons in the OEP substrate involves a considerable charge carrier multiplication.

13. A method according to one of claims 1 or 2 characterised in that the photoelectrons of the photocathode are image-formingly accelerated without using a micro-channel plate directly onto the OEP surface and by virtue of ionisation and charge carrier generation permit a high level of amplification which can be easily regulated by way of the acceleration voltage.

14. Apparatus for detecting and processing signal waves, with an article OEP which is sensitive to the signal waves and in which the signal waves produce charge carriers, and at least one readout electrode (AK) connected to the charge carrier region of the article, wherein there are provided at least two modulation electrodes (MKa, MKb) of which at least one is arranged in spatial proximity with the at least one readout electrode (AK) and the other is arranged in spatial proximity either with the same readout electrode (AK) or a further readout electrode (AK2), characterised in that the modulation electrodes are arranged relative to the readout electrode or electrodes in such a way that in dependence on the sign of the modulation voltages of the respective modulation electrodes the current flowing by way of the associated readout electrode is positive or negative and that there is provided at least one device by which the relative phase relationship and/or the voltage amplitude of the two modulation voltages can be freely set.

15. Apparatus according to claim 14 characterised in that the photosensitive article is a photosensitive semiconductor material.

16. Apparatus according to claim 14 characterised in that the photosensitive article is a photocathode, provided with modulation electrodes suitable for operation in vacuum for modulation of the photoelectrons in relation to suitably designed readout electrodes in at least one single OEP or twin OEP structure, wherein the readout electrodes are preferably provided with an upstream-connected secondary electron multiplication means, preferably in the form of micro-channel plate elements, and wherein the readout current is read out with an anode readout structure or with a suitably adapted CCD or CMOS or MSM camera chip structure.

17. Apparatus according to one of claims 14, 15 or 16 characterised in that the readout and modulation electrodes are metal semiconductor contacts or Schottky diodes.

18. Apparatus according to one of claims 14, 15 or 16 characterised in that the readout electrodes (AK, AK1, AK2) and at least one respective modulation electrode (MKa) interengage comb-like, wherein the readout electrode is connected to a further readout electrode designed in the same manner, which interengages comb-like with the second modulation electrode (MKb).

19. Apparatus according to one of claims 14, 15 or 16 characterised in that a plurality of mutually independent readout electrodes and associated modulation electrodes are arranged in an array.

20. Apparatus according to one of claims 14, 15 or 16 characterised in that there are provided devices for modulation of the signal wave or waves.

21. Apparatus according to one of claims 14, 15 or 16 characterised in that an OEP structure is in the form of a PLL or DLL circuit, more specifically preferably in the form of an array, for example in a router, and/or that there is provided a PLL or DLL input circuit for detecting signal modulation or encoding and for adapting the modulation frequency and the phases of modulation of the modulation electrodes to the signal wave modulation.

22. Apparatus according to one of claims 14, 15 or 16 characterised in that the strip-shaped modulation and readout electrodes of the optoelectronic processor OEP are embodied by metal electrodes as Schottky contacts, preferably of a width of 0.1–5 µm, on a sensitive semiconductor substrate 3 adapted to the signal wave, preferably a high-ohmic ($p^-$)- or ($n^-$)-substrate or a high-ohmic ($p^-$)- or ($n^-$)-epitaxial layer, preferably with intermediate spaces of approximately the same to multiple width and preferably of a thickness adapted to the depth of penetration of the signal wave, wherein the substrate 3 is preferably at free potential (floating substrate).

23. Apparatus according to one of claims 14, 15 or 16 characterised in that the strip-shaped modulation electrodes M and readout electrodes A are embodied by ($n^+$)- and ($p^+$)-strips or channels, for example of a width in the approximately 0.1 to 5 µm range, on a sensitive semiconductor substrate adapted to the signal wave or the epitaxial layer 3, preferably an intrinsically conducting to high-ohmic ($p^-$)- or ($n^-$)-substrate respectively which preferably with the strip electrodes forms blocking PN junctions with a deeply extended space charge zone and preferably with intermediate spaces approximately of the same to multiple width.

24. Apparatus according to one of claims 14, 15 or 16 characterised in that in each case the electrodes M and/or A are covered by preferably insulated screening metal electrodes of suitable width and are preferably capacitively coupled to modulation sources, wherein the M-screening metal electrodes and the A-screening metal electrodes are preferably connected to push-pull modulation sources.

25. Apparatus according to one of claims 14, 15 or 16 characterised in that the readout unit VAEH of the single OEP with the inherently contained interlinking of the readout currents involves influence regions of the at least two modulation voltages or the interlinking and readout unit VAEH of the multiple OEP is in the form at the input side of a low-ohmic current readout circuit.

26. Apparatus according to one of claims 14, 15 or 16 characterised in that the current readout circuit of the partial OEPs is individually or group-wise in the form of direct current summing corresponding to the wired-OR principle, preferably with subsequently single Miller integrator for correlation applications or in which for example two partial OEPs are read out by a differential Miller integrator, wherein the polarity of the modulation voltages is taken into consideration for those modulation conditions MZP (positive/negative), MZN (negative/positive) and MZ0 (both positive or both negative) with respect to the wired-OR summing.

27. Apparatus according to one of claims 14, 15 or 16 characterised in that the OEP structure or the OEP functionality is effected in metal electrodes (ME)-pn technology or in Schottky technology with a semiconductor substrate 3 adapted to the wavelength range of the signal wave, for example of Si, preferably CMOS technology, GeSi quantum well structures, GaAs, InGaAsP, InSb, HgCdTe etc. as a preferably high-ohmic n-substrate or p-substrate.

28. Apparatus according to one of claims 14, 15 or 16 characterised in that capacitive crosstalk of a high-frequency modulation signal from the modulation electrodes to the readout electrodes and to the readout terminal AK is suppressed by suitable capacitive compensation with a suitable push-pull voltage.

29. Apparatus according to one of claims 14, 15 or 16 characterised in that the twin or quadruple OEPs are enlarged to an OEP matrix of the size M×N, wherein M and N are integers greater than 1.

30. Apparatus according to one of claims 14, 15 or 16 characterised in that a readout electrode group for example at the readout terminal AK has a capacitance CA in relation to earth and is connected preferably to a transimpedance amplifier, with an ohmic transimpedance for logic and mixing applications and a capacitive transimpedance as a Miller integrator for correlation applications, wherein the latter circuit has at least one reset switch, and wherein preferably the same terminal AK is connected by way of a suitable capacitor CK for compensation of the crosstalk of the modulation electrodes to the readout electrodes to a voltage which is complementary in relation to the respective modulation voltage.

31. Apparatus according to one of claims 14, 15 or 16 characterised in that the OEP structures on the side of the incident signal wave are provided with anti-reflective coatings and preferably having regard to the partial OEPs with microlenses and are preferably provided with reflective layers on the opposite side, and that the signal source SQ and the OEP receiving device are each provided with a suitable optical means.

* * * * *